United States Patent [19]

Bitts

[11] Patent Number: 5,250,909

[45] Date of Patent: Oct. 5, 1993

[54] AUTOMATIC FAULT DETECTION SYSTEM IN ELECTRICAL SENSING CIRCUIT

[75] Inventor: Donald R. Bitts, Grand Prairie, Tex.

[73] Assignee: Benz Companies, Inc., Fort Worth, Tex.

[21] Appl. No.: 886,620

[22] Filed: May 21, 1992

[51] Int. Cl.[5] ............................................. G01R 31/02
[52] U.S. Cl. .................................. 324/542; 324/503;
  324/539; 324/556; 340/650; 340/651; 340/946
[58] Field of Search .............. 324/500, 503, 512, 522,
  324/537, 538, 555, 556, 539, 542; 340/635, 650,
  651, 652, 946, 963

[56]         References Cited
        U.S. PATENT DOCUMENTS

| | | | |
|---|---|---|---|
| 3,629,816 | 12/1971 | Gillund | 324/503 X |
| 3,825,307 | 7/1974 | Carr et al. | 324/503 X |
| 3,955,183 | 5/1976 | McBrian | 340/214 |
| 3,963,981 | 6/1976 | Vis | 324/51 |
| 4,001,818 | 1/1977 | Radichel et al. | 324/537 X |
| 4,070,660 | 1/1978 | Tauber | 340/236 |
| 4,086,570 | 4/1978 | Wakasa et al. | 340/172 |
| 4,166,243 | 8/1979 | West et al. | 324/51 |
| 4,219,805 | 8/1980 | Magee et al. | 340/631 |
| 4,667,187 | 5/1987 | Volk et al. | 340/641 |
| 4,673,912 | 6/1987 | Kumasaka et al. | 340/635 |
| 4,728,898 | 3/1988 | Staley, Jr. | 324/522 |
| 4,783,631 | 11/1988 | Nakashima et al. | 324/538 |
| 4,845,435 | 7/1989 | Bohan, Jr. | 324/537 |
| 5,045,840 | 9/1991 | Berrier et al. | 340/652 |
| 5,166,880 | 11/1992 | Furui | 340/436 X |
| 5,187,465 | 2/1993 | Stonerook et al. | 340/438 |

Primary Examiner—Kenneth A. Wieder
Assistant Examiner—Glenn W. Brown
Attorney, Agent, or Firm—Geoffrey A. Mantooth

[57]         ABSTRACT

An electrical sensing circuit has a sensor device and an indicator such as a warning light. The system of the present invention continuously monitors the operational status of the sensing circuit. Normally open sensors are provided with a resistance across the open circuit contacts to provide a small leakage current. For each sensor, high and low comparators are provided. The high comparator is ground seeking and is used to detect closure of open circuit sensors, grounded connections and systems tests. The low comparator detects open circuits or high resistances such as might be caused by broken or loose wires, improperly connected sensors or electrically degrated sensors. The comparators drive logic components, which in turn drive indicators of circuit operational readiness.

13 Claims, 2 Drawing Sheets

AUTOMATIC FAULT DETECTION SYSTEM IN ELECTRICAL SENSING CIRCUIT

FIELD OF THE INVENTION

The present invention relates to systems that detect faults in electrical sensing circuits.

BACKGROUND OF THE INVENTION

Helicopters are equipped with many sensors that advise the pilot of the condition of various on board systems. There are normally open sensors, which close the circuit when the sensor is activated, and normally closed sensors, which open the circuit when activated. The sensors are connected to indicators such as warning lights on the pilots instrument panel. The sensor is typically located remote from the indicator. Therefore, the electrical connections typically pass through several harnesses, junction boxes, terminal boards, etc.

An example of a normally open sensor is a chip detector. A chip detector is used to monitor the health or air worthiness of a helicopter's transmission or gear box, which is a vital piece of equipment. The presence of a significant number of metal chips in the transmission fluid usually indicates mechanical problems with the transmission. The chip detector is partially immersed in the transmission fluid so as to be exposed to the metal chips circulating inside of the fluid. The chip detector is provided with a magnet so as to attract and retain the metal chips. The presence or absence of metal chips captured by the chip detector is indicated both visually and electrically. The electrical indication is provided by a warning light on the instrument panel. If metal chips accumulate during flight, the warning light is illuminated and the pilot can safely land the helicopter, before the rotors lock up.

The visual indication is provided between flights by a ground mechanic. The mechanic physically removes the chip detector from the transmission, visually inspects the collection area on the chip detector for metal chips, and then reinstalls the chip detector into the transmission. A visual inspection of the chip detector is required after the helicopter is flown for a specified number of hours. (In Canada, the chip detector is required to be visually inspected every day.)

Several problems can and have arisen due to the frequent removal and installation of chip detectors. Because the chip detector is in contact with transmission fluid, failure to properly reinstall the chip detector could result in a loss of fluid during flight. In fact, this very problem occurred in a helicopter flying over the Gulf of Mexico. The loss of transmission fluid during flight resulted in a forced landing of the helicopter on the water. One of the flotation devices on the helicopter failed, resulting in the helicopter flipping over and sinking.

Thus, with the required frequent handling of the chip detector component of the transmission, the possibility for loss of life or aircraft due to human error is significant. The electrical indication circuit provides no clue as to improper installation of an open circuit sensor such as a chip detector. What is needed is a system for detecting the improper installation of a chip detector.

Another problem caused by frequent handling of the chip detector is broken wires. Wires lead from the chip detector to the warning light in the cockpit instrument panel. These wires can be easily broken as the chip detector is handled during the visual inspection process. A broken wire results in the disablement of the electric circuit. In the prior art, there is Berrier, et al., U.S. Pat. No. 5,045,840, owned by the assignee of the present invention. Berrier, et al. provides a continuity sensor that can be installed across an open circuit device such as a chip detector. Upon the application of power to the circuit in the cockpit, the continuity sensor temporarily closes the circuit to illuminate the warning light. If the warning light illuminates, the interconnections leading from the warning light to the chip detector are in working order. However, if the warning light fails to illuminate, then the chip detector circuit is inoperable.

The Berrier, et al. continuity sensor has proven to be a noteworthy and much needed device. Before the Berrier, et al. continuity sensor, prior art electrical sensing circuits with normally open sensors were vulnerable to open circuit faults. With the Berrier continuity sensor, such open circuit faults can be identified and corrected.

It is desired to supplement the Berrier, et al. continuity sensor to, as mentioned above, detect if a chip detector has been improperly installed. In addition, it is desired to provide a system to monitor the continuity of wires leading to the chip detector on a continuous basis. Further still, it is desired to provide a system to monitor the electrical status of the chip detector or other open circuit sensor so as to detect degradation of the contacts.

SUMMARY OF THE INVENTION

It is the object of the present invention to provide a system as discussed above.

The present invention provides a fault detection system in an electrical sensing circuit. The electrical sensing circuit includes an indicator, a sensor and conductors that are connected to the sensor. The fault detection system includes means for providing a leakage current through the sensor. There is also means for detecting an open circuit or high resistance in the conductors and the sensor. The means for detecting are connected to the conductors. It is also provide with means for driving the indicator in response to a detected open circuit or high resistance. The means for driving is connected to the means for detecting and to the indicator.

In one aspect of the present invention, the means for detecting includes a comparator, where the comparator compares the voltage on the conductors to a predetermined voltage. In another aspect of the present invention, the means for driving comprises a field effect transistor.

In still another aspect of the present invention, this fault detection system further includes means for detecting a closed circuit in the conductors and the sensor. The means for detecting the closed circuit is connected to the conductors. There is provided a means for driving the indicator in response to a detected closed circuit.

In still another aspect of the present invention, there is provided a fault detection system in an electrical sensing system. The electrical sensing system includes plural sensors, with each sensor having respective conductors connected thereto. There is a first indicator for each sensor. The fault detection system includes means for each sensor for providing leakage current through the respective sensor. There is also a means for each sensor for detecting an open circuit or high resistance in the respective sensor and the respective conductors. Each of the means for detecting is connected to the respective conductors. There is a means for each sensor for driving the respective first indicator There is also provided a second indicator and means for each sensor for driving the second indicator in response to the detected open circuit or high resistance in the respective conductors.

DESCRIPTION OF THE PREFERRED EMBODIMENT

Figure 1:
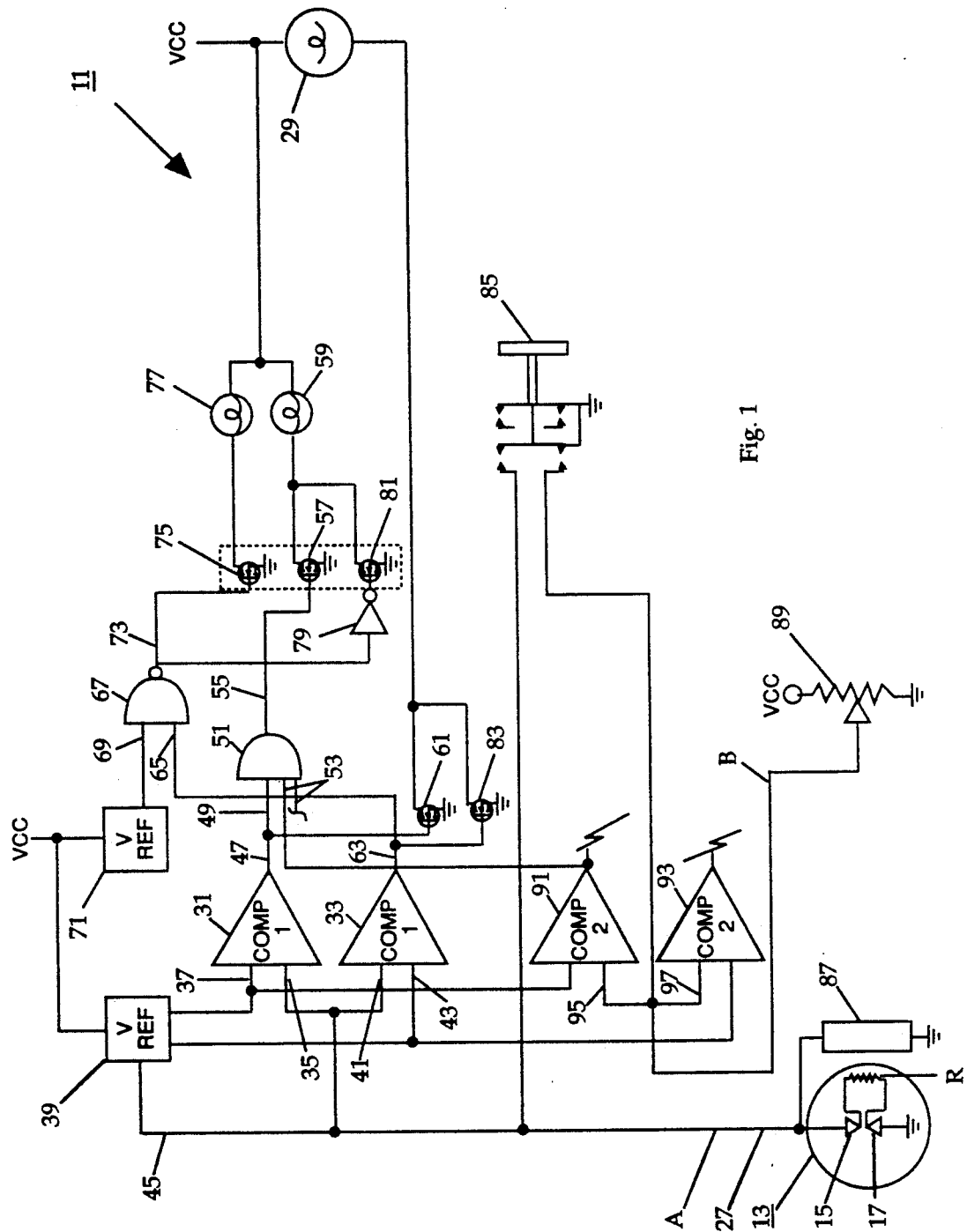
FIG. 1 is an electrical schematic diagram showing the system of the present invention, in accordance with a preferred embodiment.

Referring the FIG. 1, the system 11 of the present invention is shown. The system 11 monitors the status of one or more sensors 13, 89 and also the status of the respective sensor circuit In the preferred embodiment, the sensor is a chip detector 13, which is an open circuited device. The chip detector 13 has been modified by wiring a resistor R across the open circuit contacts 15, 17.

Figure 2:
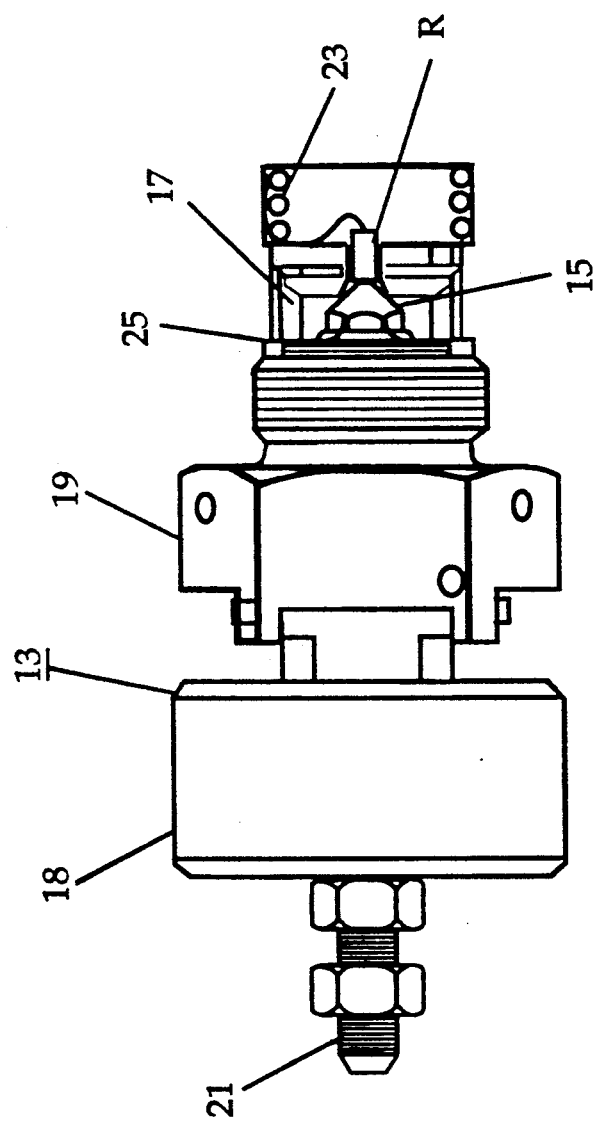
FIG. 2 a side, partially cut away view, of a chip detector as modified for use in the present invention.

Referring to FIG. 2, the chip detector 13 is shown. The chip detector has a removable plug 18 and a fixed or seat portion 19. The seat 19 is fixed to the transmission housing by threads. The plug 18 can be removed for visual inspection. The plug 18 has the tip contact 15 while the seat has the ground contact 17. The resistor R is located inside of the chip detector seat 19 so that when the chip detector plug 18 is inserted into the seat in the transmission, the tip contact 15 of the plug contacts one end of the resistor R. This tip contact 15 is electrically connected to the terminal 21 on the plug, which receives a wire 27 (see FIG. 1). The other end of the resistor R is connected to the ground contact 17 of the seat, via a coil spring 23 in the seat. This location of the resistor R allows chips to collect in the area 25 between the tip contact 15 and the ground contact 17.

Referring again to FIG. 1, the chip detector 13 is connected via electronics to a warning light 29 located inside of the instrument panel in the cockpit of a helicopter. The warning light 29 is connected to a supply voltage $V_{cc}$. When the electronics and/or the chip detector complete the circuit to ground, the warning light 29 illuminates.

The electronics provide comparators to detect a voltage level above or below a predetermined level. Each channel has a high comparator 31 and a low comparator 33. Thus, for the chip detector channel, the high comparator 31 has one input 35 connected to the tip contact 15 of the chip detector and the other input 37 connected to a reference voltage supply 39. The reference voltage supply 39 is connected to the supply voltage $V_{cc}$. The reference voltage input 37 into the high comparator 31 is set at a first predetermined level (e.g. 3-3.5 V). The low comparator 33 has one input 41 connected to the tip contact 15 of the chip detector and the other input 43 connected to the reference voltage supply 39. The reference voltage input 43 into the low comparator is set at a second predetermined level (e.g. 0.7-1.5 V). The reference voltage supply is also connected to the tip contact through wire 45. This output on wire 45 of the reference voltage supply 39 provides a high voltage to the continuity sensor 87 (which will be explained below). The high voltage is provided through a voltage divider, which utilizes resistor R. Thus, if chips close the chip detector circuit, the high voltage from wire 45 is pulled low.

The output 47 of the high comparator 31 is connected to one input 49 of an AND gate 51. The other inputs 53 of the AND gate 51 are connected to high comparator outputs from the other channels which service other sensors. The output 55 of the AND gate 51 is connected to the gate of a field effect transistor (FET) 57. The source and drain of the FET are connected to an amber light 59 and ground respectively. The amber light 59 is connected to the supply voltage $V_{cc}$. The output of the high comparator 31 is also connected to the gate of a FET 61, which is connected in series to the instrument panel warning light 29 for the chip detector.

The output 63 of the low comparator 33 is connected to one input 65 of a NAND gate 67. The other input 69 of the NAND gate 67 is connected to a reference voltage supply 71, which supplies a third predetermined level (e.g. 5 V) so as to produce a high input. The output 73 of the NAND gate 67 is connected to the gate of an FET 75 that drives a green light 77 by providing a connection to ground. The green light 77 is connected to the supply voltage $V_{cc}$. The output 73 of the NAND gate 67 is also connected to the input of an inverter 79. The output of the inverter 79 is connected to the gate of a FET 81 that drives the amber light 59 by providing a connection to ground. Thus, the amber light 59 is connected to two FETS 57, 81 that are connected to ground in parallel with each other. The output of the low comparator 33 is also connected to a FET 83 that drives the instrument panel warning light 29 by providing a connection to ground. Thus, the instrument panel warning light 29 is connected to two FETS 61, 83, that are respectively driven by the high and low comparators. The two FETS 61, 83 are connected to ground in parallel with each other.

There is also provided a press-to-test button 85 in the cockpit instrument panel. The press-to-test button 85 is normally open, but when pressed by a pilot, it provides a connection to ground for the tip contact inputs 35, 41 of the two comparators 31, 33. The green and amber lights 77, 59 may be physically located within the press-to-test button 85 so as to conserve instrument panel space.

There is also provided a continuity sensor 87 located adjacent to the chip detector 13. The continuity sensor is connected across the chip detector contacts 15, 17. The construction and operation of the continuity sensor 87 is described in Berrier, et al., U.S. Pat. No. 5,045,840, the disclosure of which is herein incorporated by reference. The continuity sensor 87 provides continuity across a chip detector whenever power is applied to the wire 27. Power is applied to the wire 27 by the high voltage on wire 45, whenever the system 11 is powered up. The continuity sensor 87 maintains continuity for a predetermined amount of time, (e.g. 5-10 seconds) and then breaks continuity.

The system 11 of the present invention can service plural channels, with each channel having a sensor. As exemplified in FIG. 1, a first channel A is connected to the open circuit chip detector 13. A second channel B is connected to a sensor 89 that uses a potentiometer. The second channel contains its own high and low comparators 91, 93, a NAND gate (not shown) and two FETS (not shown) for driving the respective instrument panel warning light (not shown). These electronics components of the second channel B are identical in configuration to the electronic components of the first channel A.

The outputs of the comparators are connected to the same FETS that drive the green and amber lights 77, 59. Thus, the green and amber lights 77, 59 and their FET drivers 57, 75, 81 are common to all channels. In addition, the AND gate 51 is common to all channels. The press-to-test button 85 is also connected to the non-voltage reference inputs 95, 97 of the comparators 91, 93.

With sensor 89, unlike the chip detector 13, a path to ground through the potentiometer is already provided. The reference voltages provided to the high and low comparators 91, 93 can be the same as in the first channel A, as shown in FIG. 1, or other reference voltages can be provided.

The operation of the system will now be described in general. An illuminated green light 77 indicates that the fault monitoring system 11 is normal. If the sensor is activated and changes voltage (as when the chip detector is provided a path to ground through captured chips), then the warning light 29 comes on and the green light 77 stays on. This indicates that the system is operating normally and that the sensor 13 has been activated.

If an open circuit or high resistance fault is present in channel A, the green light 77 goes off and the amber light 59 and the respective warning light 29 comes on. The warning light allows the pilot to identify which channel has the fault.

The system can be tested by either pressing the press-to-test button 85 or applying power to the continuity sensor 87. This illuminates all of the lights; the green light 77, the amber light 59 and the warning lights (such as 29) located in the instrument panel. Illumination of all lights indicates that the system is operating normally. If the green light fails to come on during a test, then an open circuit or high resistance fault is present in one of the channels. Identification of the channel occurs by ending the test (by releasing the press-to-test button and by waiting for the continuity sensor to turn off) so that the normal channels turn off the respective warning lights. This leaves the affected channel warning light 29 on.

If a fault is indicated by the amber and warning lights, yet the system tests normally (all lights, including the green light 77 come on), then this indicates that there is a problem with the chip detector 13. The chip detector could be out of its hole (that is the plug 18 is not in electrical contact with its seat 19) and transmission fluid may be leaking.

In general, the high comparator 31 is ground seeking, changing state from low to high when a ground is present in the channel. Such a ground can be caused due to activation of the test button 85, the presence of chips in the chip detector 13 or by a grounded wire. The low comparator 33 is high seeking, changing state from low to high when an open circuit or high resistance is present in the channel. Such an open circuit or high resistance can be caused by a broken or loose wire, the chip detector being out of the hole (so that the tip contact 15 no longer contacts the resistor R) or by the chip detector contacts degrading due to corrosion or coking (thereby causing a decrease in the leakage current through resistor R). Resistor R is selected so as to provide a suitable known leakage current. The resistor R, in the preferred embodiment, is 1000 ohms. Specific changes in the leakage current are detected by the two comparators.

Now, the operation of the system will be described more specifically. The green light 77 is illuminated to indicate that the system is normal. In a quiescent state, the outputs of the high and low comparators 31, 33 are low. This drives the output of the NAND gate 67 high, which turns on FET 75 and illuminates the green light 77. Also, FET 81 is held open by the inverter, to keep the amber light 59 off.

To test the system, the press-to-test button 85 is pressed, wherein the green light stays on, and the amber light 59 and the warning lights 29 illuminate. Closure of the press-to-test button provides a ground to the inputs 35, 41. The high comparator 31, which is ground seeking, changes its output 47 to high. This high is input to the AND gate 51. Assuming the other channels are free of faults, all of the other channels also provide high inputs into the AND gate. This causes the AND gate 51 to switch high, which closes FET 57 to illuminate the amber light 59. In addition, the high output 47 of the high comparator 31 switches FET 61 on to illuminate the warning light 29. In fact, all of the warning lights for the other channels are illuminated. Thus, when pressing the press-to-test button 85, all of the lights are illuminated to indicate that the system is in working order. When the press-to-test button is released, the green light 77 stays on and the amber light 59 and the warning lights go off after the continuity sensor 87 turns off.

The same test automatically occurs every time power is first applied to the chip detector 13. Power is applied to wire 27 by turning on the system, so as to energize the reference voltage supply 39, or by releasing the press-to-test button 85 after it has been pressed. When power is applied, wire 27 has a high voltage, which activates the continuity sensor 87. This application of power causes the continuity sensor 87 to provide continuity to ground for a predetermined amount of time (for example 5 to 10 seconds). When continuity is provided, the amber light 59 and the warning light 29 illuminate as when the press-to-test button is pressed. Only those warning lights that are in a circuit with a continuity sensor 87 are illuminated. After the predetermined amount of time has passed, the continuity sensor opens and the amber light and warning light go off.

If a sufficient amount of chips become lodged in the chip detector 13, or if a wire is shorted to ground, then the warning light 29 illuminates to inform the pilot of an activation of the circuit. The chips in the chip detector provide a path to ground. This ground causes the output 47 of the high comparator 31 to go high. The amber light 59 stays off because only one channel is affected and the AND gate 51 stays low.

The operation of the system when a circuit fault is present will now be described. If there is an open circuit or high resistance in Channel A, the system 11 automatically detects this fault. The amber light 59 and the warning light 29 are illuminated, while the green light 77 is turned off. This indicates a fault condition in the channel shown by the specific warning light 29. The low comparator 33 senses the open circuit or high resistance and switches its output 63 high. This illuminates the warning light 29 and also the amber light 59 by way of the NAND gate 67 and the inverter 79. The green light 77 is turned off. This condition will persist until repaired.

When a fault is indicated, the system can be tested by activating the press-to-test button 85. If the fault is between the continuity sensor 87 and the comparators, the green light 77 will stay off. This indicates a loose or broken wire in the channel. However, if the green light 77 comes on, this indicates that the circuit to the continuity sensor 87 is operational, and that the chip detector is presenting the fault condition. The chip detector 13 is either out of the hole or the chip detector has degraded due to contact corrosion or coking. If the chip detector is out of the hole, the transmission fluid could be leaking, a dangerous possibility.

Although the present invention has been described with reference to helicopters, it can be used in other electrical systems as well.

The foregoing disclosure and the showings made in the drawings are merely illustrative of the principles of this invention and are not to be interpreted in a limiting sense.

I claim:

1. A fault detection system, comprising:
   a) a sensor and conductors connected to said sensor, said sensor being of the normally open circuit type;
   b) means for providing a leakage current through said sensor;
   c) means for detecting an open circuit or high resistance in said conductors and said sensor, said means for detecting being connected to said conductors;
   d) means for driving an indicator in response to a detected open circuit or high resistance, said means for driving being connected to said means for detecting and to said indicator.

2. The system of claim 1 wherein said means for detecting comprises a comparator, said comparator comparing a voltage on said conductors to a predetermined voltage.

3. The system of claim 2 wherein said means for driving comprises a field effect transistor.

4. The system of claim 1, wherein said means for driving said indicator in response to a detected open circuit or high resistance is a first means for driving said indicator, further comprising:
   a) means for detecting a closed circuit in said conductors and said sensor, said means for detecting a closed circuit being connected to said conductors;
   b) second means for driving said indicator in response to a detected closed circuit, said second means for driving said indicator in response to a detected closed circuit being connected to said means for detecting a closed circuit and to said indicator.

5. The system of claim 4 wherein said means for detecting a closed circuit comprises a second comparator, said second comparator comparing a voltage on said conductors to a second predetermined voltage.

6. A fault detection system, comprising:
   a) plural sensors, with respective conductors being connected to each sensor and a respective first indicator for each sensor, at least one of said sensors being of the normally open circuit type;
   b) for each sensor, means for providing a leakage current through said respective normally open sensor;
   c) for each sensor, means for detecting an open circuit or high resistance in said respective sensor and said respective conductors, each of said means for detecting being connected to said respective conductors;
   d) for each sensor, means for driving said respective first indicator in response to a detected open circuit or high resistance, said means for driving said respective first indicator being connected to said respective means for detecting and to said respective first indicator;
   e) a second indicator;
   f) for each sensor, means for driving said second indicator in response to said detected open circuit or high resistance in any of said conductors, said means for driving said second indicator being connected to said respective means for detecting and to said respective first indicator.

7. The system of claim 6 wherein said respective means for driving said respective first indicator is a first means for driving said respective first indicator, further comprising:
   a) for each sensor, means for detecting a closed circuit in said respective conductors and said respective sensor, said respective means for detecting a closed circuit being connected to the respective conductors;
   b) for each sensor, second means for driving said respective first indicator in response to a detected closed circuit by said respective means for detecting a closed circuit, said respective second means for driving said first indicator being connected to said respective means for detecting a closed circuit and to said respective first indicator.

8. The system of claim 7 further comprising:
   a) a third indicator;
   b) means for driving said third indicator when no open circuit in said respective conductors is detected, said means for driving said third indicator being connected to each of said means for detecting an open circuit and to said third indicator.

9. A method of detecting faults in an electrical sensing circuit, said electrical sensing circuit comprising an indicator, a sensor and conductors connected to said sensor, said sensor being of the normally open type, comprising the steps of:
   a) providing a leakage current through said normally open type sensor;
   b) detecting an open circuit or high resistance in said conductors and said sensor;
   c) driving said indicator in response to a detected open circuit or high resistance.

10. The method of claim 9 further comprising the steps of:
    a) detecting a closed circuit in said conductors and said sensor;
    b) driving said indicator in response to said detected closed circuit.

11. A method of detecting faults in an electrical sensing system, said electrical sensing system comprising plural sensors, with respective conductors connected to each sensor, and a first indicator for each sensor, where at least one of said plural sensors is of the normally open circuit type, comprising the steps of:
    a) providing a leakage current through said normally open sensor;
    b) detecting an open circuit or high resistance in each of said respective sensors and said respective conductors;
    c) in response to said detected open circuit, driving said respective first indicator;
    d) providing a second indicator;
    e) driving said second indicator in response to said detected open circuit or high resistance in any of said conductors.

12. The method of claim 11 further comprising the steps of:
    a) detecting a closed circuit in said respective conductors and said respective sensors;
    b) driving said respective first indicator in response to said detected closed circuit.

13. The method of claim 12 further comprising the steps of:
    a) providing a third indicator;
    b) driving said third indicator when no open circuit in said respective conductors is detected.

* * * * *